United States Patent
Ichimura

(10) Patent No.: US 7,348,041 B2
(45) Date of Patent: Mar. 25, 2008

(54) ANTIREFLECTION FILM MADE OF A CVD $SiO_2$ FILM CONTAINING A FLUORO AND/OR ALKYL MODIFIER

(75) Inventor: Koji Ichimura, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 160 days.

(21) Appl. No.: 10/470,580

(22) Filed: Apr. 9, 2003

(65) Prior Publication Data

US 2004/0157061 A1    Aug. 12, 2004

Related U.S. Application Data

(63) Continuation of application No. 08/985,904, filed on Dec. 5, 1997, now abandoned.

(30) Foreign Application Priority Data

Dec. 18, 1996  (JP)  ................................... 8-354141
Oct. 31, 1997  (JP)  ................................... 9-315992

(51) Int. Cl.
*C23C 16/40* (2006.01)

(52) U.S. Cl. ...................... 427/497; 427/503; 427/568; 427/574; 427/578

(58) Field of Classification Search ................ 427/497, 427/503, 568, 574, 489, 578; 428/446, 447, 428/451, 437, 441, 442

See application file for complete search history.

(56) References Cited

U.S. PATENT DOCUMENTS 4,419,386 A * 12/1983 Gordon ...................... 427/109

(Continued)

FOREIGN PATENT DOCUMENTS

EP  517 548 A2  12/1992

(Continued)

OTHER PUBLICATIONS

Grant & Hackh's Chemical Dictionary, Fifth Edition, Edited by Roger Grant and Claire Grant, p. 192 (1987)or tin doped indium oxide layer.*

(Continued)

*Primary Examiner*—D. S Nakarani
(74) *Attorney, Agent, or Firm*—Oliff & Berridge, PLC

(57) ABSTRACT

A low refractive index $SiO_2$ film is provided which uses a starting material for forming an $SiO_2$ film and has a lower refractive index than the conventional $SiO_2$ film. A starting material gas comprising a gas containing a fluorine atom, a gas containing a silicon atom and an alkyl group having 1 to 4 carbon atoms or an alkyl group having 1 to 4 carbon atoms with a part or the whole of hydrogen atoms substituted by a fluorine atom, and a gas containing an oxygen atom is subjected to plasma CVD in a vacuum chamber 1 to form an $SiO_2$ film on a web 2 in a plasma zone 5. The $SiO_2$ film thus formed has, at least one low refractive index element selected from a fluorine atom, an alkyl group having 1 to 4 carbon atoms, and an alkyl group having 1 to 4 carbon atoms with a part or the whole of hydrogen atoms substituted by a fluorine atom, and the $SiO_2$ film with the low refractive index element introduced thereinto has a lower refractive index than an $SiO_2$ film with the low refractive index element not introduced thereinto.

1 Claim, 1 Drawing Sheet

U.S. PATENT DOCUMENTS

| | | | |
|---|---|---|---|
| 5,264,286 A | * 11/1993 | Ando et al. | 428/432 |
| 5,380,585 A | 1/1995 | Ogawa et al. | 428/333 |
| 5,616,369 A | * 4/1997 | Williams et al. | 427/536 |
| 5,759,635 A | 6/1998 | Logan | 427/490 |
| 5,759,643 A | 6/1998 | Miyashita et al. | 428/1 |
| 5,909,314 A | * 6/1999 | Oka et al. | 359/582 |

FOREIGN PATENT DOCUMENTS

| | | |
|---|---|---|
| EP | 704 885 A2 | 4/1996 |
| EP | 724 286 A1 | 7/1996 |
| WO | WO 92/20833 | 11/1992 |
| WO | WO 94/11544 | 5/1994 |
| WO | WO 98/25023 | 8/1996 |

OTHER PUBLICATIONS

Patent Abstracts of Japan, vol. 097, No. 12, Dec. 25, 1997 & JP 09 203817 A (Toyo Commun. Equip. Co. Ltd.) Aug. 5, 1997 Abstract.

Chemical Abstracts, vol. 123, No. 6, Aug. 7, 1995, Columbus, Ohio, Abstract No. 72560 P002100589 & JP 07 090589 A (GTC KK) Apr. 4, 1995.

Low Dielectric Constant Interlayer Using Fluorine-Doped Silicon Oxide, Usami et al., Japanese Journal of Applied Physics, vol. 33, No. 18, Jan. 1, 1994, pp. 408-412, XP000577615.

Pure and fluorine-doped silica films deposited in a hollow cathode reactor for integrated optic applications, Bazylenko et al., Journal of Vacuum Science and Technology: Part A, vol. 14, No. 2, Mar. 1, 1996, pp. 336-345, XP000620519.

* cited by examiner

ANTIREFLECTION FILM MADE OF A CVD SiO₂ FILM CONTAINING A FLUORO AND/OR ALKYL MODIFIER

BACKGROUND OF THE INVENTION

The present invention relates to a low refractive index $SiO_2$ film which is applicable to a light antireflection film on various surfaces of curve mirrors, back mirrors, goggles, window glasses, displays of personal computers and word processors, and other various commercial displays.

In recent years, antireflection films have been applied to surfaces of various displays of word processors, computers, and televisions, surfaces of various optical lenses and optical articles, and surfaces of window glasses of automobiles and electric railcars to prevent the reflection of light from the above surfaces.

An about 0.1 μm-thick thin film of $MgF_2$ formed on glass will be described as an example of the antireflection film. It is already known that, when incident light perpendicularly enters a thin film, in order for the antireflection film to prevent the reflection of light by 100% and to pass light by 100% therethrough, relationships represented by the equations (1) and (2) should be met (see "Science Library" Physics=9 "Optics," pp.70-72, 1980, Science Sha Ltd., Japan).

$$n_0 = \sqrt{n_g} \quad (1)$$

$$n_0 h = \lambda_0/4 \quad (2)$$

wherein $\lambda_0$ represents a specific wavelength, $n_0$ represents the refractive index of the antireflection film at this wavelength, h represents the thickness of the antireflection film, and $n_g$ represents the refractive index of the substrate.

It is already known that the refractive index $n_g$ of glass is about 1.5, the refractive index $n_0$ of $MgF_2$ film is 1.38, and the wavelength $\lambda_0$ of incident light is 5500 Å (reference). When these values are substituted in the equation (2), the results of calculation show that the thickness h of the antireflection film is about 0.1 μm which is the thickness of an optical thin film. For this reason, an optical thin film having such thickness has been used as the antireflection film. Vacuum process, such as vacuum deposition, sputtering, ion plating, and plasma CVD, have been known to be suitable for the formation of such an optical thin film.

From the equation (1), it is apparent that prevention of the reflection of light by 100% can be attained by the selection of such a material that the refractive index of the upper coating is approximately equal to a value of square root of the refractive index of the lower coating. The antireflection of light by utilizing the above principle to make the refractive index of the upper coating lower than the refractive index of the lower coating, that is, by providing a thin film of a high refractive index layer and a thin film of a low refractive index layer in that order on a substrate, has hitherto been performed in the art.

An $SiO_2$ film is generally known as a low refractive index film and hence has been extensively used as antireflection films and the like. Antireflection films having various layer constructions, however, have been desired to have lower refractive index.

DISCLOSURE OF THE INVENTION

Accordingly, an object of the present invention is to provide a low refractive index $SiO_2$ film which uses a starting material for forming an $SiO_2$ film and has a lower refractive index than the conventional $SiO_2$ film.

According to one aspect of the present invention, there is provided a low refractive index $SiO_2$ film comprising an $SiO_2$ film with a low refractive index element introduced thereinto, the low refractive index element being at least one member selected from the group consisting of a fluorine atom, an alkyl group having 1 to 4 carbon atoms, and an alkyl group having 1 to 4 carbon atoms with a part or the whole of hydrogen atoms substituted by a fluorine atom.

Formation of a film in such a state that at least one low refractive index element selected from the group consisting of a fluorine atom, an alkyl group having 1 to 4 carbon atoms, and an alkyl group having 1 to 4 carbon atoms with a part or the whole of hydrogen atoms substituted by a fluorine atom is introduced into an $SiO_2$-forming material, can provide a film having a lower refractive index than the $SiO_2$ film per se. The $SiO_2$ film with an low refractive index element introduced thereinto according to the present invention has lower refractive index than the $SiO_2$ film per se and hence is useful as a film as the upper layer in an antireflection film.

An $SiO_2$ film with a fluorine atom introduced thereinto is usually in such a state that a silicon atom is bonded to a fluorine atom. Upon exposure of the $SiO_2$ film having this bond to an atmosphere having an excessive water vapor content, the bond is likely to be hydrolyzed by moisture in air, causing the low refractive index effect to be lost. Therefore, according to a preferred embodiment of the present invention, an alkyl group with a part or the whole of hydrogen atoms substituted by a fluorine atom is used as the starting material. In this case, the fluorine atom introduced into the $SiO_2$ film is bonded to the carbon atom, causing no hydrolysis, which permits the low refractive index effect to be maintained for a long period of time.

According to another aspect of the present invention, there is provided a process for producing a low refractive index $SiO_2$ film, comprising forming a thin film on a substrate by CVD using a starting material gas comprising a gas containing a fluorine atom, a gas containing a silicon atom and an alkyl group having 1 to 4 carbon atoms or an alkyl group having 1 to 4 carbon atoms with a part or the whole of hydrogen atoms substituted by a fluorine atom, and a gas containing an oxygen atom.

According to a further aspect of the present invention, there is provided a process for producing a low refractive index $SiO_2$ film, comprising the steps of:

(1) introducing a mixed gas, comprising a gas containing a fluorine atom, a volatile gas of an organic compound containing a silicon atom and an alkyl group having 1 to 4 carbon atoms or an alkyl group having 1 to 4 carbon atoms with a part or the whole of hydrogen atoms substituted by a fluorine atom, and a gas containing an oxygen atom, into a vacuum chamber maintained in a vacuum of $10^{-3}$ to 1 mmHg (Torr) and bringing the mixed gas to a plasma stream by glow discharge; and (2) bringing the plasma stream into contact with the surface of a substrate disposed within the vacuum chamber to form a thin film on the substrate.

According to the present invention, since a mixed gas, comprising a gas containing a fluorine atom, a volatile gas of an organic compound containing a silicon atom and an alkyl group having 1 to 4 carbon atoms or an alkyl group having 1 to 4 carbon atoms with a part or the whole of hydrogen atoms substituted by a fluorine atom, and a gas containing an oxygen atom, is used in the formation of a film by CVD, the resultant CVD film comprises a substantially inorganic $SiO_2$ film formed by oxidation of Si atom and, introduced into the $SiO_2$ film, a fluorine atom and/or an alkyl group having 1 to 4 carbon atoms or an alkyl group having 1 to 4 carbon atoms with a part or the whole of hydrogen atoms substituted by a fluorine atom, that is, a low refractive index element. The $SiO_2$ film with a low refractive index element introduced thereinto has a lower refractive index than an $SiO_2$ film not using a gas containing a low refractive index element, that is, an $SiO_2$ film per se. Further, the low refractive index film has high hardness and bond strength.

BEST MODE FOR CARRYING OUT THE INVENTION

Figure 1:
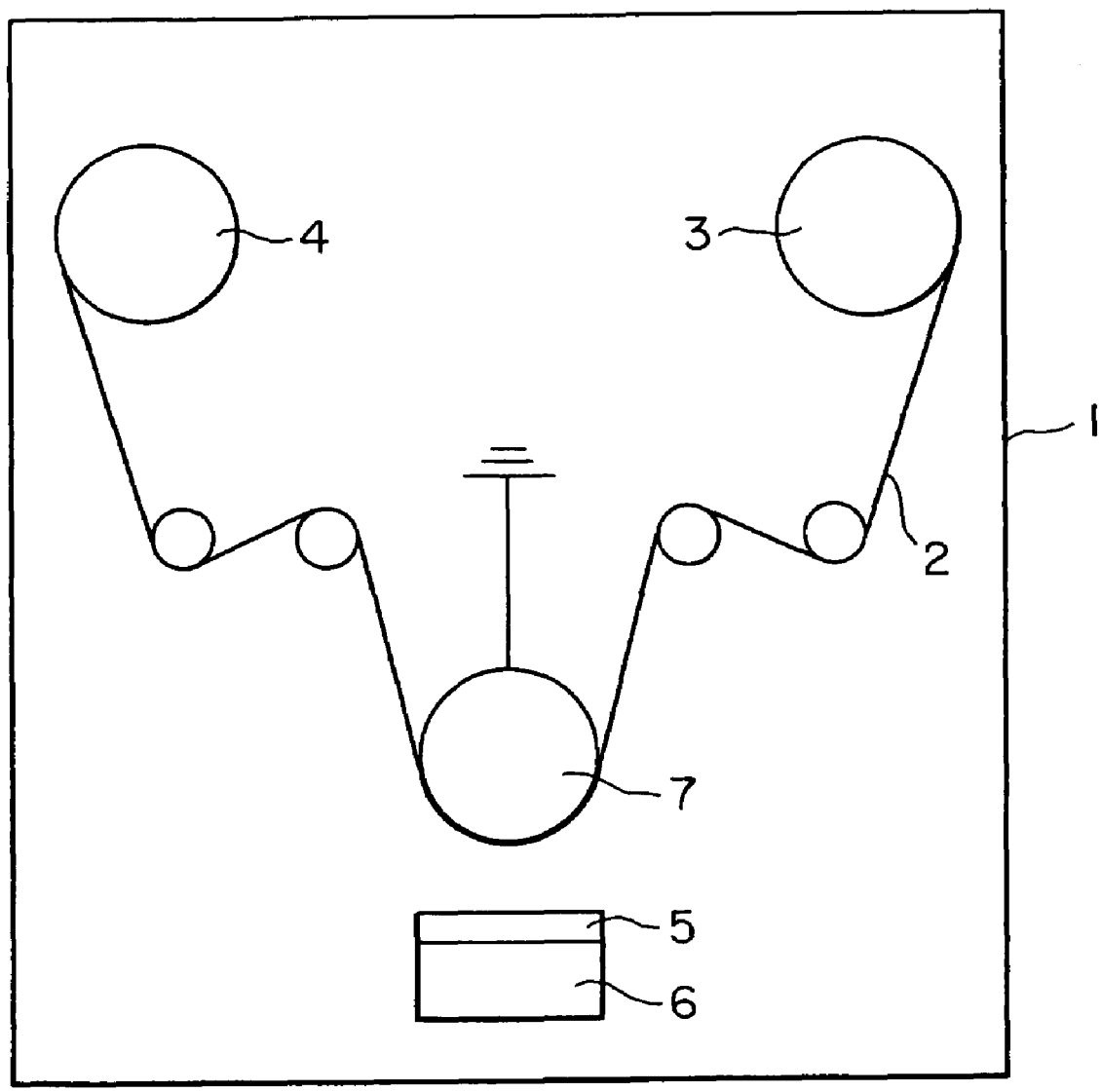
FIG. 1 is a schematic diagram showing an embodiment of the construction of a plasma CVD apparatus for producing the low refractive index $SiO_2$ film according to the present invention.

A schematic diagram showing an embodiment of the construction of a plasma CVD apparatus for producing the low refractive index $SiO_2$ film according to the present invention is shown in FIG. 1. In FIG. 1, numeral 1 designates a vacuum chamber the interior of which can be regulated to a desired degree of vacuum. A winding/unwinding mechanism containing a pair of rolls 3, 4, which can unwind or rewind a web 2 and function to travel the web 2 in a positive direction or in a reverse direction, is disposed within the vacuum chamber 1. A plasma zone 5 is disposed so as to face the surface of the web 2 travelled between the roll 3 and the roll 4. The plasma zone 5 for plasma CVD treatment comprises a section for projecting a mixed starting material gas, a flat electrode 6, and a film forming drum 7 which can stably travel the web 2 and is grounded. The flat electrode 6 may be a gas projecting electrode which projects an inert gas to create plasma.

A gas containing a fluorine atom, a gas containing a silicon atom and an alkyl group having 1 to 4 carbon atoms or an alkyl group having 1 to 4 carbon atoms with a part or the whole of hydrogen atoms substituted by a fluorine atom, and a gas containing an oxygen atom are used as the starting material for forming a low refractive index $SiO_2$ film by CVD according to the present invention.

The gas containing a fluorine atom is added in order to make the refractive index of the resultant film lower than that of the $SiO_2$ film per se, and examples thereof include $CF_4$, $C_2F_6$, $C_3F_6$, and $SF_6$.

The material containing a silicon atom and an alkyl group having 1 to 4 carbon atoms is a main starting material for the low refractive index film. The alkyl group having 1 to 4 carbon atoms, particularly a methyl or ethyl group, is introduced in order to make the refractive index of the resultant film lower than that of the $SiO_2$ film per se. The starting material containing a silicon atom and an alkyl group having 1 to 4 carbon atoms is gasified upon introduction into the vacuum chamber. In the present invention, the reason why the number of carbon atoms of the alkyl group in the material to be gasified is limited to 1 to 4 is that a starting material containing an alkyl group having 5 or more carbon atoms is less likely to be vaporized in CVD, making it difficult to form a low refractive index film.

Gasifiable starting materials containing a silicon atom and an alkyl group having 1 to 4 carbon atoms include silicon-containing organic compounds, such as hexamethyldisiloxane (abbreviation: HMDSO), tetramethyldisiloxane (abbreviation: TMDSO), octamethylcyclotetrasiloxane, tetraethoxysilane (abbreviation: TEOS), methyltrimethoxysilane (abbreviation: MTMOS), methylsilane, dimethylsilane, trimethylsilane, diethylsilane, propylsilane, and phenylsilane. Preferred are HMDSO, TMDSO, and TEOS. HMDSO is particularly preferred. For each of these preferred and particularly preferred compounds, the molecule contains an alkyl group having 1 to 4 carbon atoms, such as a methyl or ethyl group, a silicon atom, and an oxygen atom.

According to a further preferred embodiment of the present invention, the material containing a silicon atom and an alkyl group having 1 to 4 carbon atoms as the main starting material is such that a part or the whole of hydrogen atoms in the alkyl group having 1 to 4 carbon atoms has been substituted by a fluorine atom. In this case, the fluorine atom is stably bonded to the carbon atom to offer the effect of stably maintaining the low refractive index effect.

Gasifiable starting materials, containing a silicon atom and an alkyl group having 1 to 4 carbon atoms with a part or the whole of hydrogen atoms substituted by a fluorine atom, usable herein include HMDSO, TMDSO, octamethylcyclotetrasiloxane, TEOS, MTMOS, methylsilane, dimethylsilane, trimethylsilane, diethylsilane, propylsilane, and phenylsilane, a part or the whole of hydrogen atoms in each of the above compounds being substituted by a fluorine atom.

The gas containing an oxygen atom is used in order to oxidize the Si material to give $SiO_2$.

Further, other gaseous materials may be added to the mixed gas composed of the above gases from the viewpoint of imparting desired properties.

In the introduction of the mixed gas comprising the Si material gas and the fluorine gas into the vacuum chamber, the flow (SLM) ratio is preferably 1:0.1 to 20.

In plasma CVD, the vacuum chamber is preferably kept at a pressure of $10^{-3}$ to 1 mmHg (Torr).

An antireflection film will be described as a preferred example of products with the low refractive index $SiO_2$ film, according to the present invention, formed thereon. A polyethylene terephthalate (PET) substrate (a product of Toray Industries, Inc., tradename: Lumirror T-60, thickness: 100 μm) is provided as a substrate. A 125 Å-thick ITO layer, a 250 Å-thick $SiO_2$ layer, a 1000 Å-thick ITO layer, and a 800 Å-thick $SiO_2$ layer are laminated in that order on the PET substrate. The ITO layer may be formed by any means. In general, however, sputtering is applicable. Instead of the ITO layer, a $TiO_2$ or other layer formed of a high refractive index material may be used. In this case, the higher the degree to which the refractive index of the layer underlying the $SiO_2$ layer is above the refractive index of the $SiO_2$ layer, the better the antireflection effect and consequently the better the performance of the antireflection film. Further, when the ITO layer is used, electrical conductivity can be imparted to the film, permitting the film to exhibit an electromagnetic shielding property and an antistatic property. A fluororesin layer having a thickness of not more than 100 Å may be wet coated thereon from the viewpoint of forming an antismudge coating which functions to enhance the water repellency of the surface, thereby preventing the adhesion of a stain such as a fingerprint.

In the above antireflection film, the ITO layer and the $SiO_2$ layer, which are first formed on the hard coat layer on the substrate, may be replaced with a wet coat of an organic material. Formation of the ITO layer by sputtering takes a lot of time which is causative of increased production cost. Such a change in film forming means is advantageous from the viewpoint of the cost. The adhesion of the ITO layer formed on the wet coat layer of the organic material is not very good. In this case, a layer having a small thickness (usually not more than 100 Å) of other material corresponding to an adhesive may be formed between the organic layer and the ITO layer.

If the antireflection property required is not very high (for example, when the formation of a low reflective film is contemplated), an $SiO_2$ layer alone may be formed on the hard coat. This layer construction is extensively adopted in the antireflection film for LCD from the viewpoint of the cost. In this case, TAC (a product of Fuji Photo Film Co., Ltd., tradename: Fuji Tac, thickness: 100 μm) possessing optical properties, that is, not having birefringence, may be used as the substrate.

The process for producing the low refractive index $SiO_2$ film of the present invention by plasma CVD will be described with reference to the following examples.

EXAMPLE 1

TMDSO, oxygen, and $CF_4$ were used as starting material gases, and argon was used as a gas for producing plasma. These gases were introduced, as a mixed gas composed of TMDSO (0.1 SLM), oxygen (20 SLM), $CF_4$ (0.22 SLM), and argon (0.35 SLM), into a vacuum chamber of a plasma CVD apparatus with a pressure regulated to 40 mTorr ($4 \times 10^{-2}$ mmHg), and an electric power of 2.1 kW and 40 kHz was applied between the film forming drum and the gas projecting electrode to produce plasma. On the other hand, a PET film (a product of Toray Industries, Inc., Japan; tradename: Lumirror T-60, thickness: 100 μm) as a substrate was fed into and passed through a plasma producing zone at a feed rate of 1.5 m/min to form an $SiO_2$ film on the substrate.

The antireflection effect of the $SiO_2$ film was confirmed as follows. A black vinyl tape was applied to the back surface of the substrate to eliminate the reflection of the back surface. In this state, the reflectance of the front surface in the visible light region was measured at an incident angle of 5°, and the refractive index of the $SiO_2$ film was evaluated based on the minimum reflectance. As a result, it was found that the minimum reflectance was 1.76% and the refractive index was 1.47.

COMPARATIVE EXAMPLE 1

For comparison, a film of Comparative Example 1 was formed in the same manner as in Example 1, except that $CF_4$ alone was omitted.

As a result, the $SiO_2$ film formed without use of $CF_4$ had a minimum reflectance of 1.95% and a refractive index of 1.483. Thus, the $SiO_2$ film formed using $CF_4$ in Example 1 had lower reflectance and lower refractive index.

EXAMPLE 2

Oxygen was used as a part of the starting material, and argon was used as a carrier gas for producing plasma. These gases were introduced, as a mixed gas composed of oxygen (30 sccm) and argon (30 sccm), into a vacuum chamber of a plasma CVD apparatus with a pressure regulated to 40 mTorr. HMDSO (hexamethyldisiloxane) as a monomer material was bubbled by this carrier gas to feed the monomer material into the vacuum chamber of the CVD apparatus with a pressure regulated to 40 mTorr. The bubbling temperature was room temperature. Plasma was produced by applying an electric power of 100 W and 13.56 MHz across the upper electrode and the earth electrode.

A PET film [a product of Toray Industries, Inc., tradename: Lumirror T-60, thickness: 100 μm] was used as a substrate, and the film formation time was 10 min. The refractive index of the film thus formed was measured by ellipsometry and found to be 1.42. The film was analyzed by IR spectrometry for the presence of a $CH_3$ group. As a result, a peak derived from stretching of an Si—$CH_3$ bond appeared around 1277 $cm^{-1}$, indicating the presence of the $CH_3$ group.

COMPARATIVE EXAMPLE 2

For comparison, the procedure of Example 2 was repeated, except that the flow rate of oxygen was 100 sccm. Thus, an $SiO_2$ film of Comparative Example 2 was formed. The $SiO_2$ film was analyzed by IR spectroscopy. As a result, the presence of a $CH_3$ group was hardly observed. The refractive index of the $SiO_2$ film formed in Comparative Example 2 was measured by ellipsometry and found to be 1.44, which was higher than the refractive index of the $SiO_2$ film, with the $CH_3$ group introduced thereinto, prepared in Example 2.

EXAMPLE 3

A PET film (a product of Toray Industries, Inc., tradename: Lumirror T-60, thickness: 100 μm) was provided as a substrate. Oxygen, argon, and $CF_4$ were used as the starting material gases. Further, HMDSO (hexamethyldisiloxane) was used as the monomer material. The gas flow rate was 30 sccm for oxygen, 30 sccm for argon, and 30 sccm for $CF_4$. The monomer material was bubbled using the argon gas as a carrier gas and fed into a vacuum chamber of a plasma CVD apparatus with the pressure being regulated to 40 mTorr. The bubbling temperature was room temperature.

An electric power of 100 W and 13.56 MHz was applied across the upper electrode and the earth electrode to produce plasma. The film formation time was 10 min. The refractive index of the $SiO_2$ film with fluorine atom introduced thereinto was measured by ellipsometry and found to be 1.40.

COMPARATIVE EXAMPLE 3

For comparison, in the formation of an $SiO_2$ film, $CF_4$ was not used to form an $SiO_2$ film with a fluorine atom not introduced thereinto, and the refractive index of the $SiO_2$ film with no fluorine atom introduced thereinto was measured by ellipsometry and found to be 1.42, which was higher than the refractive index (1.40) of the $SiO_2$ film, with the fluorine atom introduced thereinto, prepared in Example 3.

EXAMPLE 4

A PET film (a product of Toray Industries, Inc., tradename: Lumirror T-60, thickness: 100 μm) was provided as a substrate. Oxygen and argon were used as the starting material gases. Further, HMDSO (hexamethyldisiloxane) with H in the $CH_3$ thereof being substituted by F was used as the monomer material. The gas flow rate was 30 sccm for oxygen and 30 sccm for argon. The monomer material was bubbled using the argon gas as a carrier gas and fed into a vacuum chamber of a plasma CVD apparatus with the pressure being regulated to 40 mTorr. The bubbling temperature was room temperature.

An electric power of 100 W and 13.56 MHz was applied across the upper electrode and the earth electrode to produce plasma. The film formation time was 10 min. The refractive index of the $SiO_2$ film was measured by ellipsometry and found to be 1.40.

For both the $SiO_2$ film formed in this example (Example 4) and the $SiO_2$ film formed in Example 3, the initial refractive index was 1.40. These $SiO_2$ films were allowed to stand for three days under high temperature and high humidity conditions (80° C., 95% RH). As a result, the $SiO_2$ film formed in Example 4 underwent no change in refractive index, whereas the refractive index of the $SiO_2$ film prepared in Example 3 was increased to 1.45. This demonstrates that, in the $SiO_2$ film with a fluorine atom introduced thereinto, use of HMDSO, with H in the $CH_3$ group substituted by F, rather than use of $CF_4$ resulted in better high temperature and high moisture resistance.

The refractive index $SiO_2$ film with at least one low refractive index element selected from a fluorine atom, an alkyl group having 1 to 4 carbon atoms, and an alkyl group having 1 to 4 carbon atoms with a part or the whole of hydrogen atoms thereof being substituted by a fluorine atom has lower refractive index than the $SiO_2$ film with no low refractive index element introduced thereinto.

The invention claimed is:

1. A process for producing an antireflection film comprising a substrate, an ITO layer on the substrate, and a $SiO_2$ film on the ITO layer, the $SiO_2$ film comprising a modifier introduced therein, said modifier comprises an alkyl group having 1 to 4 carbon atoms, said method comprising:
    forming the ITO layer on the substrate, and
    forming the $SiO_2$ film by CVD using HMDSO, wherein a mixture of oxygen and an inert gas is introduced into a vacuum chamber of a plasma CVD apparatus at a flow rate of oxygen to the inert gas of 1:1, whereby the thus formed $SiO_2$ film comprises a Si—$CH_3$ bond.

* * * * *